United States Patent
Takei et al.

(10) Patent No.: US 7,365,023 B2
(45) Date of Patent: Apr. 29, 2008

(54) POROUS UNDERLAYER COATING AND UNDERLAYER COATING FORMING COMPOSITION FOR FORMING POROUS UNDERLAYER COATING

(75) Inventors: Satoshi Takei, Toyama (JP); Yasushi Sakaida, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 59 days.

(21) Appl. No.: 10/553,675

(22) PCT Filed: Apr. 16, 2004

(86) PCT No.: PCT/JP2004/005446

§ 371 (c)(1),
(2), (4) Date: Oct. 31, 2005

(87) PCT Pub. No.: WO2004/092840

PCT Pub. Date: Oct. 28, 2004

(65) Prior Publication Data
US 2006/0211256 A1    Sep. 21, 2006

(30) Foreign Application Priority Data
Apr. 17, 2003  (JP) ............................. 2003-112667

(51) Int. Cl.
*H01L 21/469* (2006.01)
*H01L 21/302* (2006.01)
(52) U.S. Cl. .................. 438/758; 438/778; 438/780
(58) Field of Classification Search ............... None
See application file for complete search history.

(56) References Cited

U.S. PATENT DOCUMENTS

| 5,693,691 A | 12/1997 | Flaim et al. |
| 5,919,599 A | 7/1999 | Meador et al. |
| 6,791,649 B1 * | 9/2004 | Nakamura et al. .......... 349/137 |
| 6,803,168 B1 * | 10/2004 | Padmanaban et al. ... 430/270.1 |
| 2001/0021726 A1 | 9/2001 | Brown |
| 2002/0018886 A1 * | 2/2002 | Matsufuji et al. ........... 428/328 |

(Continued)

FOREIGN PATENT DOCUMENTS

JP    A 2000-512402    9/2000

(Continued)

OTHER PUBLICATIONS

Lynch et al., "Properties and Performance of Near UV Reflectivity Control Layers," SPIE vol. 2195, pp. 225-229, 1994.

(Continued)

*Primary Examiner*—Duy-Vu N Deo
(74) *Attorney, Agent, or Firm*—Oliff & Berridge, PLC (57) ABSTRACT

There is provided an underlayer coating causing no intermixing with photoresist layer and having a high dry etching rate compared with photoresist, which is used in lithography process of manufacture of semiconductor device. Concretely, it is an underlayer coating forming composition for forming a porous underlayer coating for use in manufacture of semiconductor device, comprising a blowing agent, an organic material and a solvent, or a polymer having a blowing group and a solvent. The underlayer coating formed from the composition has porous structure which has pores therein, and makes possible to attain a high dry etching rate.

7 Claims, 1 Drawing Sheet

U.S. PATENT DOCUMENTS

2002/0172896 A1* 11/2002 Adams et al. .............. 430/322
2003/0207208 A1* 11/2003 Uenishi ................... 430/272.1

FOREIGN PATENT DOCUMENTS

| JP | A 2000-294504 | 10/2000 |
| JP | A 2001-272506 | 10/2001 |
| JP | A 2002-47430 | 2/2002 |
| JP | A 2002-128847 | 5/2002 |
| JP | A 2002-190519 | 7/2002 |
| JP | A 2002-207295 | 7/2002 |
| JP | A 2002-207296 | 7/2002 |
| JP | 2002-081328 * | 2/2003 |
| JP | A 2003-57828 | 2/2003 |

OTHER PUBLICATIONS

Taylor et al., "Methacrylate Resists and Antireflective Coatins for 193 nm Lithography," SPIE vol. 3678, pp. 174-185, Mar. 1999.
Meador et al., "Recent Progress in 193 nm Antireflective Coatings," SPIE vol. 3678, pp. 800-809, Mar. 1999.

* cited by examiner

FIG. 1

POROUS UNDERLAYER COATING AND UNDERLAYER COATING FORMING COMPOSITION FOR FORMING POROUS UNDERLAYER COATING

TECHNICAL FIELD

The present invention relates to a method for forming photoresist pattern for use in manufacture of semiconductor device, including a step of forming a porous underlayer coating between a semiconductor substrate and a photoresist. In addition, the present invention relates to an underlayer coating forming composition for forming a porous underlayer coating used in the formation of a photoresist pattern for use in manufacture of semiconductor device, and to a method for forming a porous underlayer coating by using the underlayer coating forming composition, and a porous underlayer coating formed form the underlayer coating forming composition.

BACKGROUND ART

Conventionally, in the manufacture of semiconductor devices, micro-processing by lithography using a photoresist has been carried out. The micro-processing is a processing method comprising forming a thin film of a photoresist on a semiconductor substrate such as a silicon wafer, irradiating actinic rays such as ultraviolet rays through a mask pattern on which a pattern for a semiconductor device is depicted, developing it to obtain a photoresist pattern, and etching the substrate using the photoresist pattern as a protective film, thereby forming fine unevenness corresponding to the pattern on the surface of the substrate. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave of a substrate have become serious problems. Accordingly, it has been widely studied to provide an anti-reflective coating between the photoresist and the substrate (Bottom Anti-Reflective Coating, BARC) in order to resolve the problem. As the anti-reflective coating, from a viewpoint of easy of use, many considerations have been done on organic anti-reflective coatings made of a light absorbing substance and a polymer compound and the like. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example U.S. Pat. Nos. 5,919,599 and 5,693,691).

The physical properties desired for organic anti-reflective coating include high absorbance to light and radioactive rays, no intermixing with the photoresist layer (to be insoluble in photoresist solvents), no diffusion of low molecular substances from the anti-reflective coating into the topcoat photoresist upon baking under heating, and a higher dry etching rate than the photoresist (see, for example, Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225-229; G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174-185; and Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800-809).

In recent years, in order to solve interconnection delay that has become clear with miniaturization in pattern rule of semiconductor devices, it has been considered to use copper as interconnect material, and to apply Dual Damascene process as interconnect forming method on the semiconductor device. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like.

However, it is difficult to apply organic material for anti-reflective coating on a substrate having a high aspect ratio, and in recent years, material with particular emphasis on filling property or flattening property has been developed (see, for example JP 2000-294504 A, JP 2002-47430 A, JP 2002-190519 A and WO 02/05035 pamphlet).

In addition, in the production of devices such as semiconductors, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example JP 2002-128847 A).

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, that is, as an underlayer of the photoresist.

Such an underlayer coating is required to have a high dry etching rate compared with the photoresist. The processing of semiconductor substrates is carried out by dry etching by using as a protective coating the photoresist on which a pattern is formed. In this process, prior to the substrate, an underlayer coating is removed by dry etching by using as a protective coating the photoresist. Thus, film thickness of the photoresist is reduced also in the removal of the underlayer coating. In addition, if it takes a long time to remove the underlayer coating, the reduced amount of the photoresist becomes large, and this causes a problem that the photoresist cannot maintain a film thickness required for the processing of substrates. Particularly, in recent years, in order to prevent collapse of photoresists with miniaturization in line-width of photoresist pattern, it comes to be desired to reduce the thickness of photoresists. Therefore, an underlayer coating removable for a short time, that is, an underlayer coating having a high dry etching rate comes to be required than ever before.

Taking the above-mentioned present status into account, the present inventors have eagerly studied, and as a result of it, found that when as an underlayer coating, a coating having pores, that is, a porous underlayer coating is adopted, the removal rate thereof by dry etching can be increased, and they completed the present invention.

That is, an object of the present invention is to provide a method for forming photoresist pattern for use in manufacture of semiconductor device, including a step of forming a porous underlayer coating having a high dry etching rate on a semiconductor substrate.

In addition, another object of the present invention is to provide an underlayer coating forming composition used for forming a porous underlayer coating, and further to provide a porous underlayer coating formed from the composition, and to a method for forming a porous underlayer coating by using the composition.

DISCLOSURE OF INVENTION

The present invention relates to the following aspects:
as a first aspect, a method for forming photoresist pattern for use in manufacture of semiconductor device, including a step of forming a porous underlayer coating on a semiconductor substrate; a step of forming a photoresist layer on the porous underlayer coating; a step of exposing the semiconductor substrate covered with the porous underlayer coating and the photoresist to light; a step of developing the photoresist after the exposure to light; and a step of removing the porous underlayer coating corresponding to a part of developed and removed photoresist by etching;
as a second aspect, the method for forming photoresist pattern as described in the first aspect, further including a step of forming an anti-reflective coating or a flattening coating before or after the step of forming a porous underlayer coating on a semiconductor substrate;
as a third aspect, the method for forming photoresist pattern as described in the first aspect, wherein the porous underlayer coating is formed by applying an underlayer coating forming composition containing a blowing agent or a polymer having a blowing group on a semiconductor substrate, and heating it;
as a fourth aspect, an underlayer coating forming composition for forming a porous underlayer coating for use in manufacture of semiconductor device, comprising a blowing agent, an organic material and a solvent;
as a fifth aspect, an underlayer coating forming composition for forming a porous underlayer coating for use in manufacture of semiconductor device, comprising a polymer having a blowing group and a solvent;
as a sixth aspect, an underlayer coating forming composition for forming a porous underlayer coating for use in manufacture of semiconductor device, comprising a polymer having a blowing group, an organic material and a solvent;
as a seventh aspect, the underlayer coating forming composition as described in the fourth aspect, wherein the blowing agent is a blowing agent that is decomposed with heat to generate nitrogen, carbon dioxide or water vapor;
as an eighth aspect, the underlayer coating forming composition as described in the fifth or sixth aspect, wherein the polymer having a blowing group is a polymer that is decomposed with heat to generate nitrogen, carbon dioxide or water vapor;
as a ninth aspect, the underlayer coating forming composition as described in the fourth or sixth aspect, wherein the organic material is an organic material containing at least one component selected from the group consisting of a polymer, a crosslinking compound and a light absorbing compound;
as a tenth aspect, the underlayer coating forming composition as described in the ninth aspect, wherein the polymer is a polymer having at least one aromatic ring structure selected from the group consisting of a benzene ring, a naphthalene ring, an anthracene ring and a triazine ring;
as an eleventh aspect, the underlayer coating forming composition as described in ninth aspect, wherein the crosslinking compound is a compound having at least two crosslink forming substituents;
as a twelfth aspect, the underlayer coating forming composition as described in ninth aspect, wherein the light absorbing compound is a compound having at least one ring structure selected from the group consisting of a benzene ring, a naphthalene ring, an anthracene ring and a triazine trione ring; and
as a thirteenth aspect, a method for forming photoresist pattern for use in manufacture of semiconductor device, including a step of forming a porous underlayer coating by applying the underlayer coating forming composition as described in any one of the fourth to twelfth aspects on a semiconductor substrate and heating it; a step of forming a photoresist layer on the porous underlayer coating; a step of exposing the semiconductor substrate covered with the porous underlayer coating and the photoresist to light; a step of developing the photoresist after the exposure to light; and a step of removing the porous underlayer coating corresponding to a part of developed and removed photoresist by etching.

The present invention having the above-mentioned constituents makes possible to provide a porous underlayer coating causing no intermixing with photoresists and having a high dry etching rate.

The resulting porous underlayer coating can be rapidly removed in dry etching process. Therefore, reduction in film thickness of photoresist acting as a protective coating in the processing of semiconductor substrate can be suppressed.

In addition, the method according to the present invention makes possible to secure a protective coating composed of a patterned photoresist and underlayer coating, which is required for the processing of semiconductor substrate, even when the initial film thickness of photoresist is small.

BEST MODE FOR CARRYING OUT THE INVENTION

The present invention is based on a fact that it was found for an underlayer coating having pores, that is, a porous underlayer coating to have a high etching rate.

The present invention relates to provide a method for forming photoresist pattern for use in manufacture of semiconductor device by using the porous underlayer coating; an underlayer coating forming composition used for forming the porous underlayer coating; and a method for forming a porous underlayer coating by using the underlayer coating forming composition.

In the method for forming photoresist pattern according to the present invention, a porous underlayer coating is formed on a semiconductor substrate, and then a photoresist layer is formed on the porous underlayer coating. The film thickness of the porous underlayer coating is for example 30 to 2000 nm, or 30 to 1500 nm, or for example 50 to 1500 nm. The film thickness of the photoresist layer is for example 50 to 10000, or 50 to 8000 nm, or for example 100 to 5000 nm.

In the porous underlayer coating, the rate of the volume occupied by the pores in the coating is for example 5 to 80%, or 10 to 50%, or 10 to 30%. If the rate of the pores becomes higher than the above-mentioned upper limit, it becomes difficult to form a uniform coating. In addition, the size of the pores is for example 1 to 500 nm in diameter thereof, or 1 to 50 nm. If the diameter of the pores becomes larger than the above-mentioned upper limit, it results in an adverse effect on the formation of photoresist pattern thereon.

Next, the semiconductor substrate covered with the porous underlayer coating and the photoresist layer is exposed to light such as i-line, KrF excimer laser beam, ArF excimer laser beam or the like through a predetermined mask. After the exposure to light, post exposure bake (PEB) is performed, if necessary. Then, the photoresist is partially removed according to the predetermined pattern by the development with an alkaline aqueous solution or the like ((A) in FIG. 1). In (A) in FIG. 1, (11) is a semiconductor substrate, (12) is a porous underlayer coating, and (13) is a patterned photoresist. In addition, (B) in FIG. 1 is a drawing showing a photoresist formed by using a non-porous underlayer coating (14) according to the similar process.

Figure 1:
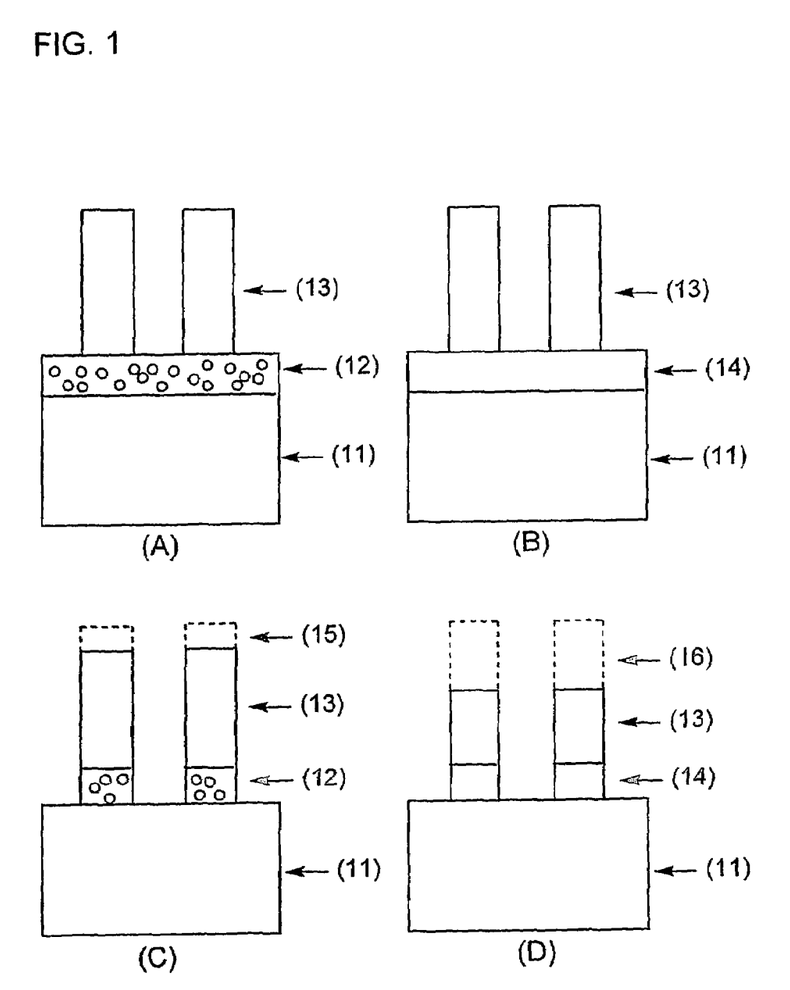
FIG. 1 is a drawing showing a sectional structure of footrests pattern of a semiconductor substrate in the production process in which the porous underlayer coating of the present invention is used, wherein reference numeral (11) shows a semiconductor substrate, (12) shows a porous underlayer coating, (13) shows a photoresist, (14) shows a non-porous underlayer coating, and (15) and (16) show parts of the photoresist where its film thickness is reduced.

Then, the underlayer coating corresponding to the part where the photoresist is removed is removed by etching and thereby the semiconductor substrate is exposed ((C) and (D) in FIG. 1 show states that the semiconductor substrate is partly exposed corresponding to (A) and (B) respectively). Thereafter, the semiconductor substrate is processed with etching by using the patterned photoresist and underlayer coating as a protective coating. Therefore, a protective coating sufficient for processing semiconductor substrate, that is, a photoresist having a sufficient thickness is required.

By the way, in the removal of the underlayer coating, not only the underlayer coating but also the photoresist is reduced in the film thickness. Therefore, if it takes a long time to remove the underlayer coating by etching, the reduced amount of the photoresist becomes large, and it becomes difficult to maintain a film thickness of the photoresist required for the processing of substrates.

As the underlayer coating used in the present invention is a coating having pores, that is, a porous underlayer coating, it has a higher removal rate by etching than non-porous underlayer coatings. Therefore, time required for removal of underlayer coatings becomes short, and the result of it, the reduced amount of the photoresist in film thickness can be suppressed. The reduced amount (15) of the photoresist in film thickness in the steps from (A) to (C) in FIG. 1 becomes small compared with the reduced amount (16) of the photoresist in film thickness in the steps from (B) to (D) in FIG. 1.

According to the present invention, the reduced amount of the photoresist in film thickness accompanied with the removal of underlayer coating becomes small, and thus it makes easy to form the patterned photoresist having a film thickness required for the processing of semiconductor substrates.

To make the initial film thickness of photoresists large leads to make an aspect ratio (height (film thickness)/width (line-width)) large. However, many disadvantages such as an increase in pattern-fall in the development of photoresists are caused with an increase in the aspect ratio. Thus, an increase in the initial film thickness of photoresists has a limit. In particular, accompanied with an miniaturization of pattern size, the initial film thickness of photoresists tends to become small. According to the present invention, even in such a condition, it is easy to maintain the film thickness of patterned photoresists required for the processing of semiconductor substrates.

The semiconductor substrates used in the present invention are not specifically limited, and generally used ones can be used. For example, silicon/silicon dioxide coat substrate, silicon nitride substrate, low dielectric constant material (low-k material) coat substrate and the like are used.

In the present invention, photoresists to be coated and formed as an upper layer of the porous underlayer coating are not specifically limited, and any of generally used negative type and positive type photoresists can be used. They includes for example a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shin-Etsu Chemical Co., Ltd., and the like can be mentioned.

As developers for photoresists, generally used developers can be used. For example, 2.0% to 3.0% alkaline aqueous solution such as tetramethyl ammonium hydroxide aqueous solution or the like is used.

In the present invention, the porous underlayer coating is removed by etching. The etching is carried out with a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride or the like.

In the present invention, before or after forming a porous underlayer coating on a substrate, an anti-reflective coating or a flattening coating may be formed. This makes possible to reduce reflection light from the substrate, make the film thickness of photoresists even and form a photoresist pattern in a high accuracy.

In the present invention, the porous underlayer coating layer can be formed by applying the underlayer coating forming composition containing a blowing agent or a polymer having a blowing group and heating.

As the blowing agent contained in the underlayer coating forming composition, compounds generating gas such as nitrogen, carbon dioxide, water vapor or the like by heating can be used. Blowing agents that is decomposed by heating at 120 to 230° C. to generate nitrogen are preferably used.

Such blowing agents include azocarboxylic acid compounds, diazoacetamide compounds, azonitrile compounds, benzenesulfohydrazine compounds, and nitroso compounds, etc. Specific examples are azodicarbonamide, barium azodicarboxylate, 2,2'-azobis-isobutyronitrile, N,N'-dinitrosopentamethylene tetramine, 4,4-oxybis-benezenesulfonyl hydrazide, 4,4'-azobis(4-cyanovaleric acid), 1,1'-azobis(cyclohexanecarbonitrile), 1,1'-azobis(N,N'-dimethylformamide), 1,1'-(azodicarbonyl) dipiperidine, 1,3-diphenyltriazene, and 4-nitrosoresorcine monomethyl ether, etc.

As the polymer having a blowing group contained in the underlayer coating forming composition, compounds generating gas such as nitrogen, carbon dioxide, water vapor or the like by heating can be used. For example, can be used addition polymerization type polymers or condensation polymerization type polymers such as polyester, polystyrene, polyimide, acryl polymer, methacryl polymer, polyvinyl ether, phenol novolak, naphthol novolak, polyether, polyamide, polycarbonate, etc. having as a side chain at least one blowing group consisting of azocarboxylic acid structure, diazoacetamide structure, azonitrile structure, benzenesulfohydrazine structure, and nitroso structure, etc. The rate of the blowing group in the polymer having a blowing group is for example 0.1 to 30 mass %, or for example 0.1 to 20 mass %, or 0.2 to 10 mass %. The molecular weight of the polymer having a blowing group is 500 or more in the terms of weight average molecular weight, for example 500 to 1000000, or 1000 to 500000, or for example 3000 to 500000, or 500 to 300000.

One of the underlayer coating forming compositions according to the present invention is basically composed of a blowing agent, an organic material and a solvent. In addition, it contains as arbitrary components a crosslinking catalyst, a surfactant and the like. The solid content in the underlayer coating forming composition of the present invention is for example 0.1 to 50 mass %, or for example 5 to 40 mass %, or 10 to 35 mass %. In this specification, the solid content means all components in the underlayer coating forming composition from which the solvent component is excluded.

In the present invention, the blowing agent is an essential component for making the underlayer coating porous. That is, the blowing agent is decomposed by heating on the formation of the underlayer coating to generate gas such as nitrogen, carbon dioxide, water vapor or the like, and thereby making the underlayer coating porous. The organic material is a component for forming an underlayer coating. In addition, the underlayer coating forming composition of the present invention is in a form of solution as it is used in a mode in which it is applied on a semiconductor substrate.

The proportion of the blowing agent in the solid content of the underlayer coating forming composition according to the present invention is for example 0.1 to 30 mass %, or for example 0.1 to 20 mass %, or 0.2 to 10 mass %. In case where the proportion of the blowing agent is lower than the above-mentioned lower limit, the formed underlayer coating has an insufficient porosity. In case where the proportion is higher than the above-mentioned upper limit, it becomes difficult to form a uniform underlayer coating. The proportion of the organic material in the solid content is for example 70 to 99.9 mass %, or for example 80 to 99.9 mass %, or 90 to 99.8 mass %.

In the underlayer coating forming composition of the present invention, the organic material is not specifically limited. Organic materials that have been used so far for forming coatings provided as an underlayer of photoresists can be used. That is, organic materials for anti-reflective coatings or organic materials for flattening, organic materials for barrier layers can be used.

As the organic material, for example components such as polymers, crosslinking compounds, light absorbing compounds and the like can be used. In addition, as the organic material, each component of polymers, crosslinking compounds and light absorbing compounds can be used alone or in a combination of two or more components.

In the combination of the organic materials, there are a case composed of a polymer and a crosslinking compound, a case composed of a crosslinking compound and a light absorbing compound, a case composed of a polymer and a light absorbing compound, and a case composed of a polymer, a crosslinking compound and a light absorbing compound. When the organic material is used in such a combination of components, the proportion of each component in the organic material is not specifically limited, and can be variously varied according to need. In case where the organic material is composed of two components, the proportion of each component in the organic material is for example 1 to 99 mass %, or 10 to 90 mass %, or 20 to 80 mass %, respectively. In case where the organic material is composed of three components of a polymer, a crosslinking compound and a light absorbing compound, the proportion of the polymer in the organic material is for example 30 to 99 mass %, or 50 to 95 mass %, or 60 to 90 mass %. The proportion of the crosslinking compound and the light absorbing compound in the organic material is for example 0.1 to 69 mass %, or 0.1 to 49 mass %, or 0.5 to 39 mass %, respectively.

The polymer used as the organic material of the underlayer coating forming composition according to the present invention is not specifically limited. Addition polymerization type polymers or condensation polymerization type polymers such as polyester, polystyrene, polyimide, acryl polymer, methacryl polymer, polyvinyl ether, phenol novolak, naphthol novolak, polyether, polyamide, polycarbonate, etc. can be used.

In case where an anti-reflective function is conferred on the underlayer coating formed from the underlayer coating forming composition of the present invention, it is required to contain a component absorbing light used for exposure in the underlayer coating.

In such a case, polymers having an aromatic ring structure such as benzene ring, naphthalene ring, anthracene ring, triazine ring, quinoline ring, quinoxaline ring or the like that acts as a light absorbing moiety are preferably used.

The polymers include for example addition polymerization type polymers having as its structural unit addition polymerizable monomers such as benzyl acrylate, benzyl methacrylate, phenyl acrylate, naphthyl acrylate, anthryl methacrylate, anthryl methylmethacrylate, styrene, hydroxystyrene, benzyl vinyl ether, N-phenylmaleimide or the like, or condensation polymerization type polymers such as phenol novolak, naphthol novolak or the like. In addition, polymers produced from triazine compound (trade name: Cymel 303, Cymel 1123), which are disclosed in U.S. Pat. No. 6,323,310 may be mentioned. Further, polymers having the following structural units (a) to (e) may be mentioned:

-continued

In case where the porous underlayer coating formed from the underlayer coating forming composition of the present invention is not required to have an anti-reflective function, polymers having no aromatic ring structure that acts as a light absorbing moiety can be used. The polymers include addition polymerization type polymers having as its structural unit only addition polymerizable monomers having no aromatic ring structure, such as acrylic acid, methacrylic acid, alkyl acrylate, alkyl methacrylate, vinyl alcohol, alkyl vinyl ether, acrylonitrile, maleimide, N-alkyl maleimide, maleic anhydride or the like.

In the present invention, when addition polymerization type polymers are used as the organic material, the polymers may be homopolymers or copolymers. For the production of the addition polymerization type polymers, addition polymerizable monomers are used. The addition polymerizable monomers include acrylic acid, methacrylic acid, an acrylate compound, a methacrylate compound, an acrylamide compound, methacrylamide compound, a vinyl compound, a styrene compound, a maleimide compound, maleic anhydride, acrylonitrile and the like.

The acrylate compound includes methyl acrylate, ethyl acrylate, n-hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxy silane, glycidyl acrylate and the like.

The methacrylate compound includes methyl methacrylate, ethyl methacrylate, n-hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxy silane, glycidyl methacrylate, 2-phenylethyl methacrylate, hydroxyphenyl methacrylate, bromophenyl methacrylate and the like.

The acrylamide compound includes acrylamide, N-methyl acrylamide, N-ethyl acrylamide, N-benzyl acrylamide, N-phenyl acrylamide, N,N-dimethyl acrylamide, N-anthryl acrylamide and the like.

The methacrylamide compound includes methacrylamide, N-methyl methacrylamide, N-ethyl methacrylamide, N-benzyl methacrylamide, N-phenyl methacrylamide, N,N-dimethyl methacrylamide, N-anthryl methacrylamide and the like.

The vinyl compound includes vinyl alcohol, 2-hydroxyethyl vinyl ether, methyl vinyl ether, ethyl vinyl ether, benzyl vinyl ether, vinyl acetate, vinyl trimethoxy silane, 2-chloroethyl vinyl ether, 2-methoxyethyl vinyl ether, vinyl naphthalene, vinyl anthracene and the like.

The styrene compound includes styrene, hydroxy styrene, chloro styrene, bromo styrene, methoxy styrene, cyano styrene, acetyl styrene and the like.

The maleimide compound includes maleimide, N-methyl maleimide, N-phenyl maleimide, N-cyclohexyl maleimide, N-benzyl maleimide, N-hydroxyethyl maleimide and the like.

The condensation polymerization type polymers used as the organic material in the present invention include for example a condensation polymerized polymer of a glycol compound with a dicarboxylic acid compound. The glycol compound includes diethylene glycol, hexamethylene glycol, butylene glycol and the like. The dicarboxylic acid compound includes succinic acid, adipic acid, terephthalic acid, maleic anhydride and the like. In addition, for example polyester, polyamide or polyimide such as polypyromellitic imide, poly(p-phenyleneterephathalic amide), polybutylene terephthalate, polyethylene terephthalate and the like may be mentioned.

The molecular weight of the polymer used as the organic material in the underlayer coating forming composition according to the present invention is for example 1000 to 1000000 in the terms of weight average molecular weight, or 3000 to 300000, or for example 5000 to 200000, or 8000 to 100000.

As the crosslinking compound used as the organic material in the underlayer coating forming composition according to the present invention, the kind thereof is not specifically limited.

The crosslinking compound includes a melamine compound, a substituted urea compound, a polymer type crosslinking compound having epoxy groups, and the like. Preferably it is a crosslinking compound having at least two crosslink forming substituents, and a compound such as methoxymethylated glycoluril or methoxy methylated melamine, or the like. For example, tetramethoxymethyl glycoluril, hexamethoxymethyl melamine, tetramethoxybenzoguanamine and the like may be mentioned. In addition, compounds such as tetramethoxymethyl urea, tetrabutoxymethyl urea and the like may be mentioned.

These crosslinking compounds can undergo crosslinking reaction due to self-condensation. In addition, when they are used in a combination with a polymer or a light absorbing compound having a crosslinking substituent such as hydroxy group or carboxy group, they can undergo crosslinking reaction with these crosslinking substituents.

When the underlayer coating forming composition of the present invention contains the crosslinking compound, the porous underlayer coating formed from the composition becomes rigid due to crosslinking reaction. That is, a crosslinking reaction occurs while the underlayer coating is formed from the underlayer coating forming composition applied on a semiconductor substrate with heating. Consequently, the formed porous underlayer coating comes to have a low solubility in an organic solvent used for photoresists, for example ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, cyclohexanone, ethyl 2-hydroxypropionate, ethyl ethoxyacetate, ethyl lactate, butyl lactate, etc.

As the light absorbing compound used as the organic material in the underlayer coating forming composition according to the present invention, the kind thereof is not specifically limited.

The selection of the kind and blending amount of the light absorbing compound makes possible to control characteristics such as refractive index, attenuation coefficient and the like of the porous underlayer coating formed from the underlayer coating forming composition according to the present invention. As the light absorbing compound, are preferably used compounds having a high absorption for light at photosensitive characteristic wavelength region of photosensitive components in a photoresist layer provided on the underlayer coating. The light absorbing compound can be used alone or in a combination of two or more.

As the light absorbing compounds, can be used phenyl compounds, benzophenone compounds, benzotriazole compounds, azo compounds, naphthalene compounds, anthracene compounds, anthraquinone compounds, triazine compounds, triazine trione compounds, quinoline compounds and the like. Phenyl compounds, naphthalene compounds, anthracene compounds, triazine compounds, triazine trione compounds and the like can be used.

As the light absorbing compounds, can be preferably used phenyl compounds having at least one hydroxy group, amino group or carboxyl group, naphthalene compounds having at least one hydroxy group, amino group or carboxyl group, or anthracene compounds having at least one hydroxy group, amino group or carboxyl group.

The phenyl compounds having at least one hydroxy group, amino group or carboxyl group include phenol, bromophenol, 4,4'-sulfonyldiphenol, tert-butylphenol, biphenol, benzoic acid, salicylic acid, hydroxyisophthalic acid, phenylacetic acid, aniline, benzyl amine, benzyl alcohol, cinnamyl alcohol, phenylalanine, phenoxypropanol, 4-bromobenzoic acid, 3-iodobenzoic acid, 2,4,6-tribromophenol, 2,4,6-tribromoresorcinol, 3,4,5-triiodobenzoic acid, 2,4,6-triiodo-3-aminobenzoic acid, 2,4,6-triiodo-3-hydroxybenzoic acid, 2,4,6-tribromo-3-hydroxybenzoic acid and the like.

The naphthalene compounds having at least one hydroxy group, amino group or carboxyl group include 1-naphthalene carboxylic acid, 2-naphthalene carboxylic acid, 1-naphthol, 2-naphthol, 1-aminonaphthalne, naphthylacetic acid, 1-hydroxy-2-naphthalene carboxylic acid, 3-hydroxy-2-naphthalene carboxylic acid, 3,7-dihydroxy-2-naphthalene carboxylic acid, 6-bromo-2-hydroxynaphthalene, 2,6-naphthalene carboxylic acid and the like.

The anthracene compounds having at least one hydroxy group, amino group or carboxyl group include 9-anthracene carboxylic acid, 9-hydroxymethylanthracene, 1-aminoanthracene and the like.

Further, as the light absorbing compound, triazine trione compounds are also used. The triazine trione compounds include the compounds of formula (1):

In the formula, X is a group of (f) to (l).

In the underlayer coating forming composition of the present invention, several solvents can be used. As the solvents, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, dimethylformamide, dimethylactamide, dimethylsulfoxide, N-methylpyrrolidone, etc. These solvents may be used singly or in combination of two or more.

Another of the underlayer coating forming compositions according to the present invention is composed of a polymer having a blowing group and a solvent, or composed of a polymer having a blowing group, an organic material and a solvent. In addition, it contains as arbitrary components a crosslinking catalyst, a surfactant and the like. The solid content in the underlayer coating forming composition of the present invention is for example 0.1 to 50 mass %, or for example 5 to 40 mass % or 10 to 35 mass %. In this specification, the solid content means all components in the underlayer coating forming composition from which the solvent component is excluded.

In the present invention, the polymer having a blowing group is an essential component for forming an underlayer coating and making the underlayer coating porous. The organic material is a component for forming an underlayer coating. In addition, the underlayer coating forming composition of the present invention is in a form of solution as it is used in a mode in which it is applied on a semiconductor.

In case where the underlayer coating forming composition of the present invention is composed of a polymer having a blowing group, an organic material and a solvent, the proportion of the polymer having a blowing group in the solid content thereof is for example 50 to 95 mass %, or for example 60 to 90 mass %, or 65 to 85 mass %, and the proportion of the organic material in the solid is for example 5 to 50 mass %, or for example 10 to 40 mass %, or 15 to 35 mass %. In case where the proportion of the polymer having a blowing group is lower than the above-mentioned lower limit, the formed underlayer coating has an insufficient porosity. In addition, as the organic material and the solvent, the compounds similar to those described above can be used.

To the underlayer coating forming composition of the present invention, acid compounds or acid generators can be added. The acid compounds or acid generators are compounds that act as a catalyst in the above-mentioned crosslinking reaction.

The acid compounds or acid generators include acid compounds such as p-toluenesulfonic acid, trifluoromethanesulfonic acid, pyridinium-p-toluenesulfonic acid, salicylic acid, sulfosalicylic acid, citric acid, benzoic acid, hydroxybenzoic acid, etc., or acid generators such as 2,4,4,6-tetrabromocyclohexadienone, 2-nitrobenzyltosylate, bis(4-t-butylphenyl)iodonium trifluoromethanesulfonate, triphenylsulfonium trifluoromethanesulfonate, phenyl-bis(trichloromethyl)-s-triazine, benzointosylate, N-hydroxysuccinimide trifluoromethanensulfonate, etc.

The blending amount of these acid compounds or acid generators is 10 mass % or less, for example 0.02 to 10 mass %, or for example 0.04 to 5 mass % in the solid contents.

The underlayer coating forming composition according to the present invention may contain further rheology controlling agents, adhesion auxiliaries, surfactants, etc. in addition to the above described ones, if necessary.

The rheology controlling agents are added mainly aiming at increasing the flowability of the underlayer coating forming composition and in particular in the heating step, increasing fill property of the underlayer coating forming composition into the inside of holes. Specific examples thereof include phthalic acid derivatives such as dimethyl phthalate, diethyl phthalate, diisobutyl phthalate or butyl isodecyl phthalate; adipic acid derivatives such as di-n-butyl adipate, diisooctyl adipate or octyldecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are added in proportions of usually less than 20 mass % in the solid content of the underlayer coating forming composition.

The adhesion auxiliaries are added mainly for the purpose of increasing the adhesion between a semiconductor substrate, or an anti-reflective coating or a photoresist layer and an underlayer coating, in particular preventing the detachment in development. Specific examples thereof include chlorosilanes such as trimethylchlorosilane, dimethylvinylchlorosilane or chloromethyldimethyl chlorosilane; alkoxysilanes such as trimethylmethoxysilane, dimethyldiethoxysilane, dimethylvinylethoxysilane, γ-methacryloxypropyltrimethoxysilane or diphenyldimethoxysilane; silazanes such as hexamethyldisilazane, N,N'-bis(trimethylsilyl)urea, dimethyltrimethylsilylamine or trimethylsilylimidazole; silanes such as γ-chloropropyltrimethoxysilane, γ-aminopropyltriethoxysilane, γ-glycidoxypropyltrimethoxysilane or γ-methacryloxypropyltrimethoxysilane; heterocyclic compounds such as benzotriazole, benzimidazole, indazole, imidazole, 2-mercaptobenzimidazole, 2-mercaptobenzoxazole, urazole, thiouracyl or mercaptopyrimidine; urea compounds such as 1,1-dimethylurea or 1,3-dimethylurea. The adhesion auxiliaries are added in proportions of usually less than 10 mass %, preferably less than 5 mass % in the solid content of the underlayer coating forming composition.

The underlayer coating forming composition according to the present invention may contain surfactants with view to preventing the occurrence of pinholes or striations and further increasing coatability. As the surfactants, mention may be made of, for example, nonionic surfactants such as polyoxyethylene alkyl ethers, e.g., polyoxyethylene lauryl ether, polyoxyethylene stearyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.5 mass % or less, preferably 0.2 mass % or less in the solid content of the underlayer coating forming composition. The surfactants may be added singly or in a combination of two or more.

Hereinafter, the utilization of the underlayer coating forming composition of the present invention is described.

On a substrate used for semiconductors (for example, silicon/silicon dioxide coat substrate, silicon nitride substrate, glass substrate, ITO substrate, polyimide substrate, low dielectric constant material (low-k material) coat substrate or the like), the underlayer coating forming composition of the present invention is coated by a suitable coating method, for example, with a spinner, a coater or the like, and thereafter the substrate is heated to fabricate a porous underlayer coating. The conditions of heating are suitably selected from heating temperature of 60 to 250° C. and heating time of 0.5 to 60 minutes. The processing provides a porous underlayer coating having uniform pores.

Next, a photoresist layer is formed on the porous underlayer coating, and thereafter the resulting substrate is exposed to light through a predetermined mask, and developed with a developer such as an alkaline aqueous solution to obtain a patterned photoresist. If necessary, post exposure bake (PEB) may be performed. Photoresists formed on the porous underlayer coating are not specifically limited, and any of negative type and positive type photoresists that are generally used may be used.

Thereafter, the porous underlayer coating corresponding to the part where the photoresist has been removed is removed by etching, and thereby the semiconductor substrate is partially exposed. The etching is carried out with tetrafluoromethane, perfluorocyclobutane or the like as mentioned above.

As the underlayer coating in the present invention is a porous underlayer coating, the removal of the underlayer coating by etching is complete for shorter time than that of non-porous underlayer coatings. Therefore, the reduced amount of the photoresist in film thickness can be suppressed. Consequently, patterned photoresists and underlayer coatings used as protective coatings on the processing of semiconductor substrates can be formed.

In the removal by dry etching, it is generally known that the higher the proportion of aromatic ring structure contained in a layer to be removed is, the lower the removal rate is. Therefore, in case where it is desired to raise the removal rate by dry etching in the porous underlayer coating of the present invention, it is preferable to reduce the amount of aromatic ring structure contained in the underlayer coating forming composition used. Particularly, it is preferable to reduce the amount of aromatic ring structure contained in a blowing agent-containing polymer component or a polymer component in the composition. Therefore, when a porous underlayer coating with a high removal rate by dry etching is required, a blowing agent-containing polymer component or a polymer that has no aromatic ring structure in the structure thereof is preferably used.

As developers for positive type photoresists, the following aqueous solutions of alkalis can be used: inorganic alkalis such as sodium hydroxide, potassium hydroxide, sodium carbonate, sodium silicate, sodium metasilicate or ammonia water, etc., primary amines such as ethylamine or n-propylamine, etc., secondary amines such as diethylamine or di-n-butylamine, etc., tertiary amines such as triethylamine or methyldiethylamine, etc., alcohol amines such as dimethylethanol amine or triethanol amine, etc., quaternary ammonium salt such as tetramethylammonium hydroxide, tetraethylammonium hydroxide or choline, etc., cyclic amine such as pyrrole or piperidine, etc. Furthermore, a suitable amount of alcohols such as isopropyl alcohol or surfactants such as anionic surfactant can be added to the above-mentioned aqueous solution of alkalis. Among them, preferable developers are quaternary ammonium salts, and more preferably tetramethylammonium hydroxide and choline.

On the porous underlayer coating of the present invention, an anti-reflective coating may be applied and formed before applying and forming a photoresist. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a light absorbing compound, a resin and a solvent, one containing as main components a resin having a light absorbing group through chemical bond, a crosslinking agent and a solvent, one containing as main components a light absorbing compound, a crosslinking agent and a solvent, one containing as main components a polymer crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The resins include polyesters, polyimides, polystyrenes, novolak resins, polyacetal resins, acrylic resins, and the like. The resins having a light absorbing group through chemical bond include resins having a light absorbing aromatic ring structure such as anthracene ring, naphthalene ring, benzene ring, quinoline ring, quinoxaline ring or thiazole ring.

The porous underlayer coating formed from the underlayer coating forming composition of the present invention may have an absorption for light used in the lithography process. In such a case, the underlayer coating can act as a layer having a prevent effect against light reflected from the substrate. Further, the porous underlayer coating of the present invention can be used as a layer for preventing an interaction between the substrate and the photoresist, as a layer having a function that prevents an adverse effect against the substrate by the material used for the photoresist or by substances formed on exposure to light of the photoresist, or as a layer having a function that prevents diffusion and adverse effects of substances formed in the substrate on heating to the upper layer photoresist.

Hereinafter, the present invention will be described based on examples but the present invention is not limited thereto.

EXAMPLES

Synthetic Example 1

In 27.91 g of propylene glycol monomethyl ether, 20.93 g of 2-hydroxypropyl methacrylate and 6.98 g of benzyl methacrylate were dissolved, and nitrogen was flowed to the reaction solution for 30 minutes, then the temperature was raised to 70° C. While the reaction solution was maintained at 70° C., 0.3 g of azobisisobutyronitrile was added. Then, the solution was stirred under nitrogen atmosphere at 70° C. for 24 hours to obtain a solution of a copolymer of 2-hydroxypropyl methacrylate with benzyl methacrylate. GPC analysis of the resulting polymer showed that it had a weight average molecular weight of 15000 in terms of standard polystyrene.

Synthetic Example 2

In 30 g of ethyl lactate, 30 g of 2-hydroxyethyl acrylate was dissolved, and nitrogen was flowed to the reaction solution for 30 minutes, then the temperature was raised to 70° C. While the reaction solution was maintained at 70° C., 0.3 g of azobisisobutyronitrile was added. Then, the solution was stirred under nitrogen atmosphere at 70° C. for 24 hours to obtain a solution of poly(2-hydroxyethyl)acrylate. GPC analysis of the resulting polymer showed that it had a weight average molecular weight of 9800 in terms of standard polystyrene.

Example 1

To 10 g of a solution containing 5 g of the polymer obtained in Synthesis Example 1, 1.15 g of hexamethoxy methyl melamine, 0.012 g of pyridinium-p-toluenesulfonic acid, 0.77 g of propylene glycol monomethyl ether and 8.66 g of dimethylsulfoxide were added to obtain 30% solution. Then, 0.309 g (5% in solid content) of blowing agent: 4,4-oxybisbenzene sulfonyl hydrazide was added thereto. Thereafter, the resulting solution was filtered through a micro filter made of polyethylene having a pore diameter of 0.20 μm to prepare an underlayer coating forming composition solution.

Example 2

To 10 g of a solution containing 5 g of the polymer obtained in Synthesis Example 1, 1.15 g of hexamethoxy methyl melamine, 0.012 g of pyridinium-p-toluenesulfonic acid, 0.77 g of propylene glycol monomethyl ether and 8.66 g of dimethylsulfoxide were added to obtain 30% solution. Then, 0.124 g (2% in solid content) of blowing agent: azodicarbonamide was added thereto. Thereafter, the resulting solution was filtered through a micro filter made of polyethylene having a pore diameter of 0.20 μm to prepare an underlayer coating forming composition solution.

Example 3

To 10 g of a solution containing 5 g of the polymer obtained in Synthesis Example 2, 1.15 g of hexamethoxy methyl melamine, 0.012 g of pyridinium-p-toluenesulfonic acid, 0.77 g of propylene glycol monomethyl ether and 8.66 g of dimethylsulfoxide were added to obtain 30% solution. Then, 0.124 g (2% in solid content) of blowing agent: azodicarbonamide was added thereto. Thereafter, the resulting solution was filtered through a micro filter made of polyethylene having a pore diameter of 0.20 μm to prepare an underlayer coating forming composition solution.

Comparative Example 1

To 10 g of a solution containing 5 g of the polymer obtained in Synthesis Example 1, 1.15 g of hexamethoxy methyl melamine, 0.012 g of pyridinium-p-toluenesulfonic acid, 0.77 g of propylene glycol monomethyl ether and 8.66 g of dimethylsulfoxide were added to obtain 30% solution. Thereafter, the resulting solution was filtered through a micro filter made of polyethylene having a pore diameter of 0.05 μm to prepare a solution of underlayer coating forming composition containing no blowing agent.

Comparative Example 2

To 10 g of a solution containing 5 g of the polymer obtained in Synthesis Example 2, 1.15 g of hexamethoxy methyl melamine, 0.012 g of pyridinium-p-toluenesulfonic acid, 0.77 g of propylene glycol monomethyl ether and 8.66 g of dimethylsulfoxide were added to obtain 30% solution. Thereafter, the resulting solution was filtered through a micro filter made of polyethylene having a pore diameter of 0.05 μm to prepare a solution of underlayer coating forming composition containing no blowing agent.

Dissolution Test in Photoresist Solvent

The underlayer coating forming composition solutions obtained in Examples 1 to 3 were coated on silicon wafers by means of a spinner. The coated silicon wafers were heated at 205° C. for 5 minutes on a hot plate to form porous underlayer coatings (film thickness 0.22 μm). The porous underlayer coatings were dipped in a solvent used for photoresists, for example ethyl lactate and propylene glycol monomethyl ether and as a result it was confirmed that the resulting coatings were insoluble in these solvents.

Test of Intermixing with Photoresist

The solutions obtained in Examples 1 to 3 were coated on silicon wafers by means of a spinner. The coated silicon wafers were heated at 205° C. for 5 minutes on a hot plate to form porous underlayer coatings (film thickness 0.50 μm). On each porous underlayer coating, a commercially available photoresist solution (manufactured by Shipley Company, trade name: APEX-E, etc.) was coated by means of a spinner. The coated wafers were heated at 90° C. for 1 minute on a hot plate. After exposure of the photoresists to light, post exposure bake was performed at 90° C. for 1.5 minute. After developing the photoresists, the film thickness of the porous underlayer coatings was measured and it was confirmed that no intermixing occurred between the porous underlayer coatings obtained from solutions prepared in Examples 1 to 3 and the photoresists.

Test of Dry Etching Rate

The underlayer coating forming composition solutions prepared in Examples 1 to 3 and Comparative Examples 1 and 2 were coated on silicon wafers by means of a spinner. The coated silicon wafers were heated at 205° C. for 5 minutes on a hot plate to form porous underlayer coatings (Examples 1 to 3) and non-porous underlayer coatings (Comparative Examples 1 and 2) (each film thickness 0.22 μm). On the other hand, a commercially available photoresist solution (manufactured by Sumitomo Chemical Co., Ltd., trade name: PAR710) was coated on a silicon wafer by means of a spinner, and heated at 120° C. for 1 minute on a hot plate to form a photoresist (film thickness 0.35 μm). Then, dry etching rate on these coatings or photoresist was measured with RIE system ES401 manufactured by Nippon Scientific Co., Ltd. under the condition in which $CF_4$ was used as dry etching gas.

The results are shown in Table 1. Dry etching selectivity means dry etching rate of underlayer coating in case where dry etching rate of photoresist is regarded as 1.00. In the table, A1 shows a copolymer of 2-hydroxypropyl methacrylate with benzyl methacrylate, A2 shows poly(2-hydroxyethyl)acrylate, B1 shows 4,4-oxybisbenzene sulfonyl hydrazide, and B2 shows azodicarbonamimde.

TABLE 1

|  | Polymer | Blowing Agent | Dry Etching Selectivity |
|---|---|---|---|
| Example 1 | A1 | B1 | 1.30 |
| Example 2 | A1 | B2 | 1.20 |
| Example 3 | A2 | B2 | 1.60 |
| Comparative Example 1 | A1 | None | 1.00 |
| Comparative Example 2 | A2 | None | 1.33 |

When underlayer coatings containing polymer A1 are compared, it was confirmed that the etching rate of the porous underlayer coatings obtained from the underlayer coating forming compositions of Examples 1 and 2 was high compared with that of the non-porous underlayer coating of Comparative Example 1. In addition, when underlayer coatings containing polymer A2 are compared, it was confirmed that the etching rate of the porous underlayer coating obtained from the underlayer coating forming composition of Example 3 was high compared with that of the non-porous underlayer coating of Comparative Example 2.

It became apparent that the introduction of blowing agents provides porous underlayer coatings having a high dry etching rate independently of the kind of polymers.

It is required that the dry etching rate of a porous underlayer coating is higher than that of a photoresist, because in the step in which the photoresist formed on the underlayer coating is developed and then a base of a substrate is exposed by etching, the fact that the dry etching rate of a porous underlayer coating is higher than that of a photoresist leads to removal of the porous underlayer coating prior to scrape-away of the photoresist, thereby a pattern of the developed photoresist can be accurately transferred to the substrate.

The invention claimed is:

1. An underlayer coating forming composition for forming a porous underlayer coating occupied by pores of 5 to 80% at a rate of volume for use in the manufacture of a semiconductor device, comprising a blowing agent, an organic material and a solvent, wherein a proportion of the blowing agent in solid content of the composition is 2 to 30 mass %, and wherein the blowing agent is selected from the group consisting of 4,4-oxybisbenzene sulfonyl hydrazide and azodicarbonamide.

2. The underlayer coating forming composition according to claim 1, wherein the blowing agent is a blowing agent that is decomposed with heat to generate nitrogen, carbon dioxide or water vapor.

3. The underlayer coating forming composition according to claim 1, wherein the organic material is an organic material containing at least one component selected from the group consisting of a polymer, a crosslinking compound and a light absorbing compound.

4. The underlayer coating forming composition according to claim 3, wherein the polymer is a polymer having at least one aromatic ring structure selected from the group consisting of a benzene ring, a naphthalene ring, an anthracene ring and a triazine ring.

5. The underlayer coating forming composition according to claim 3, wherein the crosslinking compound is a compound having at least two crosslink forming substituents.

6. The underlayer coating forming composition according to claim 3, wherein the light absorbing compound is a compound having at least one ring structure selected from the group consisting of a benzene ring, a naphthalene ring, an anthracene ring and a triazine trione ring.

7. A method for forming a photoresist pattern for use in the manufacture of a semiconductor device, comprising:
  forming a porous underlayer coating occupied by pores of 5 to 80% at a rate of volume by applying the underlayer coating forming composition according to claim 1 on a semiconductor substrate and heating it;
  forming a photoresist layer on the porous underlayer coating;
  exposing the semiconductor substrate covered with the porous underlayer coating and the photoresist to light;
  developing the photoresist alter the exposure to light; and
  removing the porous underlayer coating corresponding to a part of developed and removed photoresist by etching.

* * * * *